(12) United States Patent
Gregory et al.

(10) Patent No.: US 9,259,756 B2
(45) Date of Patent: Feb. 16, 2016

(54) DISPENSING METHOD AND DEVICE FOR DISPENSING

(71) Applicant: Liquavista B.V., Eindhoven (NL)

(72) Inventors: John Gregory, Manea March (GB); Jansen Harco, Veldhoven (NL); Ivar Schram, Weert (NL)

(73) Assignee: Amazon Technologies, Inc., Seattle, WA (US)

( * ) Notice: Subject to any disclaimer, the term of this patent is extended or adjusted under 35 U.S.C. 154(b) by 127 days.

(21) Appl. No.: 14/032,937

(22) Filed: Sep. 20, 2013

(65) Prior Publication Data

US 2014/0023792 A1    Jan. 23, 2014

Related U.S. Application Data

(63) Continuation of application No. PCT/EP2012/054710, filed on Mar. 16, 2012.

(30) Foreign Application Priority Data

Mar. 21, 2011    (GB) .................................. 1104713.1

(51) Int. Cl.
| | |
|---|---|
| B05C 5/02 | (2006.01) |
| G02B 25/00 | (2006.01) |
| G03F 7/00 | (2006.01) |
| B05D 1/00 | (2006.01) |
| B05B 1/14 | (2006.01) |
| B05C 9/06 | (2006.01) |

(52) U.S. Cl.
CPC .............. *B05C 5/0254* (2013.01); *B05D 1/007* (2013.01); *G02B 25/004* (2013.01); *G03F 7/0037* (2013.01); *B05B 1/14* (2013.01); *B05C 5/0212* (2013.01); *B05C 9/06* (2013.01)

(58) Field of Classification Search
None
See application file for complete search history.

(56) References Cited

U.S. PATENT DOCUMENTS 4,938,994 A * 7/1990 Choinski ...................... 427/96.1

FOREIGN PATENT DOCUMENTS

| | | |
|---|---|---|
| CN | 101023460 A | 8/2007 |
| EP | 0464238 A1 | 1/1992 |
| JP | H04155622 A | 5/1992 |
| JP | 2003260400 A | 9/2003 |
| JP | 2005262083 A | 9/2005 |

(Continued)

OTHER PUBLICATIONS

Keko Equipment, "Compact Coating Equipment C-Series", http://www.haikutech-printedelectronics.com, pp. 1-2. Mar. 19, 2011.
CoreFlow, "Air Floating Solutions for FPD Slit Coating", http://www.coreflow.com/solutions/fpd-coating.html, Mar. 17, 2011, pp. 1-3.

*Primary Examiner* — Timothy Meeks
*Assistant Examiner* — Michael P Rodriguez
(74) *Attorney, Agent, or Firm* — BainwoodHuang

(57) ABSTRACT

A method provides a layer of a first liquid on a first area of a surface using an elongate applicator, an elongate gap being formed between the applicator and the surface, the gap being filled with an elongate globule of the first liquid, and an amount of a second liquid being arranged in contact with the applicator and with the globule, the first liquid and the second liquid being immiscible and the first area having a higher wettability for the first liquid than for the second liquid. The method includes applying a relative motion between the applicator and the surface, wherein the amount of second liquid being arranged only on a trailing side of the applicator.

21 Claims, 3 Drawing Sheets

(56) References Cited

FOREIGN PATENT DOCUMENTS

| | | |
|---|---|---|
| KR | 1020100110787 | 10/2010 |
| WO | 2003/071346 A1 | 8/2003 |
| WO | 2005/098797 A2 | 10/2005 |
| WO | 2008125644 A1 | 10/2008 |
| WO | WO 2008125644 A1 * | 10/2008 |
| WO | WO 2009065909 A1 * | 5/2009 ............ G02B 26/02 |
| WO | 2010/133690 A1 | 11/2010 |

* cited by examiner

DISPENSING METHOD AND DEVICE FOR DISPENSING

CROSS REFERENCE TO RELATED APPLICATIONS

This application is a continuation of PCT/EP2012/054710 filed Mar. 16, 2012.

BACKGROUND

A method of providing a layer of a first fluid on an area of a surface of a support plate for use in an electrowetting display is known. In the known method a slanting support plate is immersed in a second fluid, immiscible with the first fluid. The second fluid forms a gutter near the surface of the support plate, the gutter being filled with first fluid. The gutter is moved along the surface by increasing the level of the second fluid with respect to the surface. The surface is initially covered by air, is subsequently covered by the first fluid and finally submersed in the second fluid. When the second fluid covers the entire support plate, the first fluid forms a thin layer on the area of the surface, between the support plate and the second fluid.

In this known method, a substantial amount of second liquid is consumed and all surfaces of the support plate are covered by the second fluid, whereas coverage of only one surface is necessary. The other surfaces have to be cleaned after application of the method. It is desirable to overcome this.

DETAILED DESCRIPTION

Figure 1:
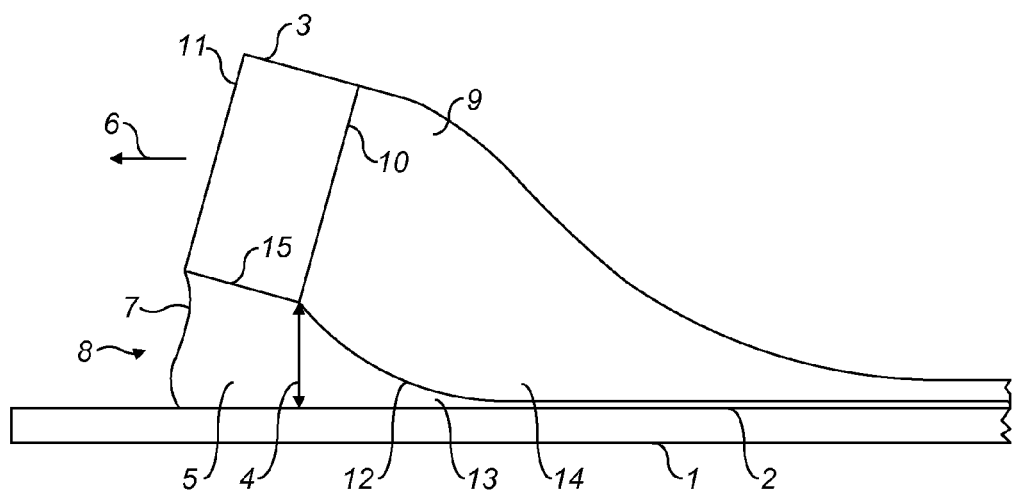
FIG. 1 shows an apparatus for depositing a layer of first liquid.

The entire contents of the following patent documents are incorporated by reference herein:
1. GB 1104713.1 filed Mar. 21, 2011
2. PCT/EP2012/054710 filed Mar. 16, 2012

In accordance with first embodiments, there is provided a method of providing a layer of a first liquid on a first area of a surface using an elongate applicator, an elongate gap being formed between the applicator and the surface, the gap being filled with an elongate globule of the first liquid, and an amount of a second liquid being arranged in contact with the applicator and with the globule, the first liquid and the second liquid being immiscible and the first area having a higher wettability for the first liquid than for the second liquid, the method including the step of applying a relative motion between the applicator and the surface, said amount of second liquid being arranged only on a trailing side of the applicator.

The support plate of which a surface has to be provided with a layer of the first liquid need not be submersed in a bath filled with the second liquid as in the known method. Instead, application of a relatively small amount of second liquid between the applicator and the surface suffices. Other surfaces of the support plate can be kept free from the second liquid, thereby reducing the requirements of cleaning these surfaces after application of the method. The method also obviates the need for large volumes of the second liquid.

The applicator may move with respect to the surface; the surface may also be moved with respect to the applicator. The applicator distributes the first liquid over the surface and thereby acts as a spreader. Since the amount of second liquid is only at the trailing side of the applicator, the surface in front of the applicator is not covered with the second liquid. The surface in front of the applicator may be adjoined by a gas, such as air. When the globule passes over the surface, a layer of first liquid is deposited on the first area and a layer of second liquid is deposited on the layer of first liquid. The second liquid will not displace the first liquid from the first surface because of the higher wettability of the first surface for the first liquid.

The method for depositing according to embodiments is easier to scale up to larger support plate sizes than the known method.

When the second liquid is polar or electroconductive, the surface provided with the first and second liquid and forming part of a support plate is particularly suitable for use in a switchable optical element, such as an electrowetting display device.

In an embodiment, the method includes the step of filling the gap by depositing an amount of the first liquid in the gap. Capillary forces cause the first liquid to spread along the length of the gap and keeps the first liquid in the gap during the motion of the applicator. The height of the gap may be smaller than 600 micrometer and may be smaller than 100 micrometer.

The first liquid may be deposited in the gap during movement of the applicator. The second liquid may be deposited as an amount of the second liquid on the surface along a side of the applicator. The second liquid may be provided after the provision of the first liquid to facilitate the deposition of the first liquid in the gap.

The normal of the surface may be arranged at a non-zero angle with the vertical. The angle can be used to tune the deposition process. When the surface is substantially horizontal, i.e. the angle is substantially zero, the production process is simplified.

In an embodiment a second area neighboring the first area has a higher wettability for the second liquid than for the first liquid. Due to the difference in wettability, the first liquid will preferentially adhere to the first areas and not to the second areas. Hence, during scanning of the applicator, the second liquid will adhere to the second areas and drive any first liquid off these areas. As a result, the first areas will be covered by a layer of the first liquid, the thickness depending, amongst others, on the shape of the globule and the speed of scanning, and the second areas will be covered by the second liquid.

When the size of the first area is small, the deposited first liquid may assume a shape approaching a semi-sphere. Such curved depositions are also covered by the term 'a layer of the first liquid'.

The surface may comprise a plurality of first areas separated by second areas and forming a pattern. The pattern or a sub-pattern may have a decorative function or act as a signage.

The gap may have at least the same length as a dimension of the pattern parallel to a long axis of the applicator. When the gap has at least the same length as a dimension of the pattern parallel to a long axis of the applicator, a uniform deposition of the first liquid on the surface will be achieved. If the first liquid is deposited on a pattern in two or more scans and part of the globule passes over a first area twice, the thickness of the layer deposited on the first area will be different from first areas over which the globule has passed only once. Therefore, the thickness will be more uniform when the pattern is filled in one sweep of a larger applicator than in several sweeps of a smaller applicator.

In an embodiment the relative motion between the applicator and the surface is in a direction substantially perpendicular to a long axis of the applicator. When the applicator and the surface move with respect to each other in a direction substantially perpendicular to a long axis of the applicator, a maximum area is covered by a single sweep of the applicator.

A borderline between a first area and a second area and a direction of a long axis of the applicator may form an angle of zero degrees to simplify the apparatus for carrying out the method.

In an embodiment of the method the angle may be different from zero degrees. The direction of the long axis determines in part the direction of the trailing edge between the first and second liquid and the surface, i.e. the edge where the first liquid is displaced from the surface by the second liquid. When this trailing edge forms a line contact with a borderline between first and second areas, not all first liquid in the second areas may be skimmed from the second area. When the borderline forms a non-zero angle with the trailing edge, there is no line contact anymore but only a point contact, which hardly shows any pinning. As a result, about all first liquid is skimmed off the second areas. An angle of 5° or more between the borderline and the long axis causes a noticeable improvement. Good skimming results are obtained for angles of 20° and more.

A rectangular pattern of first areas may therefore be arranged with its borderlines at a non-zero angle with the long axis.

A further scan of the surface by the applicator may be carried out. The uniformity of the thickness of the layer may be improved when the applicator is scanned two or more times over the surface is moved under the applicator two or more times. During the first scan the first liquid is deposited on the surface; during the following scan or scans the first liquid is redistributed over the surface, by supplementing first liquid where too little was deposited in the first scan and by removing first liquid where too much was deposited.

The surface may be part of a first support plate and the method includes the step of providing a second support plate defining a space between the first support plate and the second support plate, the space comprising the first liquid and the second liquid.

The first support plate and the second support plate may form an electrowetting element. The surface provided with the first and second liquid layer can be converted to a closed system when the surface is part of a first support plate and a second support plate is provided defining a space between the first support plate and the second support plate comprising the first liquid and the second liquid.

Further embodiments relate to an apparatus including an applicator for providing a layer of a first liquid on a first area of a surface using a method according to embodiments.

The applicator may be elongate. The apparatus may include a movement stage for moving the applicator and the surface with respect to each other. The apparatus may include a controller for controlling a height of the applicator above the surface. The apparatus can be similar to known slit coating equipment, which facilitates the development of equipment that is suitable for mass production. The apparatus may have two applicators for performing a first scan and a subsequent second scan of the same surface; the gap of the two applicators may be the same; alternatively the gap of the applicator for the first scan may be larger or smaller than the gap of the applicator for the second scan.

Examples of embodiments will now be described in detail.

FIG. 1 shows in cross-section an embodiment of an apparatus for depositing a layer of first liquid on a surface using a method according to embodiments. A plate 1, also shown in cross-section, has a surface 2 on which a layer of a first liquid is to be deposited. An applicator 3 in the form of a bar or slide is suspended above the surface 2. The applicator and the surface form a gap 4, represented in the drawing by an arrow showing the minimum distance between the applicator and the surface. The applicator has a long axis perpendicular to the plane of the drawing; the gap is elongate in the direction of the long axis. The gap is filled with an elongate globule 5 of a first liquid.

In operation the slide 3 is moved over the surface 2 in a direction 6. The globule 5 has a leading interface 7 with a gas 8 in front of the applicator 3. The interface 7 extends from the surface 2 to the applicator 3. An amount 9 of a second liquid, having an elongate shape, is arranged only at a trailing side 10 of the applicator 3 and is in contact with the applicator. The trailing side 10 of the applicator is a side that faces away from the direction of motion 6. A side 11 of the applicator that faces the direction 6 is a leading side. The globule 5 has a trailing interface 12 between the first liquid and the second liquid. The first and second liquids are immiscible.

When the applicator 3 moves over the surface 2, the moving globule 5 of first liquid 5 wets the still dry surface 2 of the plate 1 with a layer 13 of first liquid that decreases in thickness with distance from the applicator. After a certain distance, the thickness of the layer 13 becomes independent of the distance. Similarly, the amount 9 of second liquid forms a layer 14 of second liquid on the layer 13 of first liquid. In other words, the moving applicator 3 drags along a globule 5 of first liquid and an amount 9 of second liquid, both of which leave behind a layer 13, 14 on the surface 2.

The thickness of the layer 13 of first liquid that remains on the area of the surface after passage of the applicator depends, among others, on the size of the gap 4, its shape, the speed of movement of the applicator, the shape of the interface 12, viscosities of the liquids, the amount of first and second liquid applied to the applicator, interfacial tensions of the two interfaces, and the chemical contrast, i.e. the difference in hydrophobicity between the various combinations of the two liquids and the surface and the applicator.

The first liquid may be an alkane, such as hexadecane, or an oil, such as a hydro-carbon oil. The embodiment of FIG. 1 uses a silicone oil. The second liquid may be any liquid that is non-miscible with the first liquid. The second liquid may be polar or electroconductive, which is useful in some applications of the plate 1 covered with the first and second liquid. The embodiment shown uses water as the second liquid. Alternatively the second liquid may comprise a combination of water and at least one non-aqueous component, or the second liquid may comprise a first non-aqueous component and a second non-aqueous component. An example of the first component is ethylene carbonate and an example of the second component is erythritol. The gas 8 can be any gas, such as air, nitrogen or argon. The embodiment uses air. Other immiscible liquids that can be used are fluorocarbon and liquid metals such as mercury.

The area of the surface 2 shown in FIG. 1 has a higher wettability for the first liquid than for the second liquid, which prevents the second liquid from displacing the first liquid from the area. In the embodiment shown, the plate 1 can be covered by a hydrophobic layer, e.g. an amorphous fluoropolymer such as AF1600. The hydrophobic layer increases the tendency of the first liquid to join with the surface and repel the second liquid.

The shape of the interface 7 depends, among others, on the wettability of the surface 2 and the surface of the applicator 3 for the first liquid and the gas 8, and the dimensions of the gap 4. The shape of the interface 12 depends, among others, on the wettability of the surface of the applicator 3 for the first and second liquid, the shape of the applicator near the position where the interface 12 touches the applicator, and the dimensions of the gap. In the embodiment shown in FIG. 1, the shape can be changed by changing the tilt angle of the applicator.

The size of the gap between the applicator 3 and the surface 2 in the embodiment of FIG. 1 is 50 micrometer. During the motion of the applicator the size can be kept constant by controlling the position of the applicator and/or the surface 2, as is known for example from the air floating solutions for FPD (i.e. flat panel display) slit coating of the company CoreFlow or the doctor blade gap control of the coating equipment of the company Keko Equipment.

The size of the globule 5 is also determined by the amount of first liquid deposited in the gap 4. The first liquid can be deposited in the gap using for example a syringe or a pump mechanism for dispensing the desired amount of first liquid in the gap from the trailing side of the applicator. The first liquid will disperse evenly within the gap because of capillary forces. The second liquid can be deposited at the trailing side 10 also by a syringe or a pump mechanism. Using a pump mechanism, the amount of first and second liquid in contact with the applicator can be controlled; for example, they can be kept substantially constant during operation of the applicator. The second liquid may be applied after the first liquid has been deposited in the gap.

Figure 2:
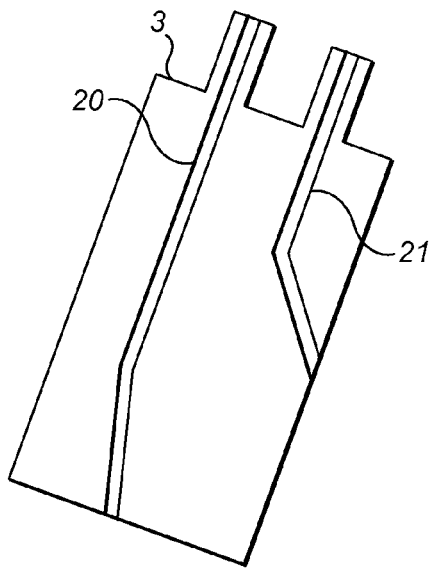
FIG. 2 shows an applicator having dispensing channels.

The first and second liquid may be deposited using a first tube outside the applicator and extending close to the gap 4 from the leading side 11 and a second tube extending close to the trailing side 10. Alternatively, the first and second liquid may be deposited using a first channel 20 in the applicator and a second channel 21 as shown in FIG. 2. The channels may be slits. A combination of tubes and channels is also feasible. A plurality of tubes and/or channels may be arranged along the length of the applicator 3.

Whereas the applicator 3 moves over a stationary surface 2 in the embodiment of FIG. 1, the applicator may also be stationary and the plate moves under the applicator. A combined movement of both applicator and plate is possible such that the applicator scans the surface of the plate.

The trailing side 10 of the applicator 3 may be hydrophilic to improve dragging the amount 9 of second liquid over the surface 2. A surface 15 of the applicator 3, facing the surface, can be made hydrophobic to improve the containment of the first liquid in the gap.

Although the cross-section of the applicator in the embodiment of FIG. 1 is a rectangle, it may also be round and have the shape of a rod. In the latter case, the position where the interface 12 touches the applicator may be fixed by making the trailing side of the rod hydrophilic and the side facing the gap hydrophobic. A rod-shaped applicator can be rotated to provide an extra process parameter for control, for instance for lifting the first liquid from the surface at areas that do not need to be coated.

Figure 3:
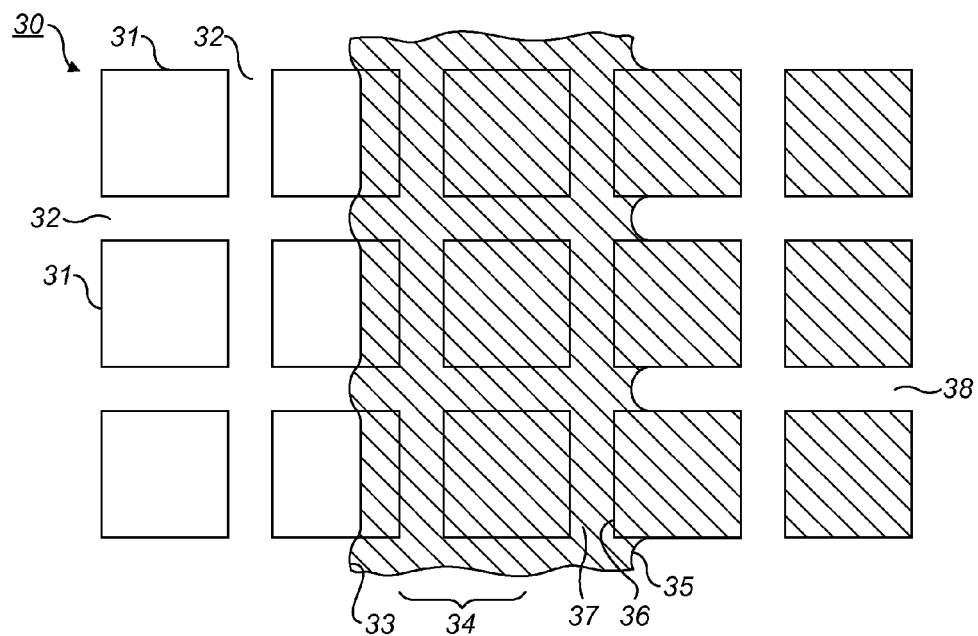
FIG. 3 shows a pattern of a surface partly covered by first liquid.

FIG. 3 shows a top view of a surface having a pattern. The pattern 30 comprises first areas 31, in this embodiment squares, having a higher wettability for the first liquid than for the second liquid. The squares may be made of a layer of AF1600. A neighboring second area 32 has a higher wettability for the second liquid than for the first liquid. The second area 32 may be made of a layer of a variety of materials, including a photoresist, such as SU8. The second area may be formed by arranging a separate layer having the form of the second area on an uninterrupted layer that forms the first areas. When the first area is hydrophobic, the separate layer should be hydrophilic. The separate layer may be formed by e.g. a printing method or evaporation. The second areas may also be formed by walls having a height, which mechanically restrain the first liquid to the first area. The size of the first areas may be 170 micrometer by 170 micrometer and the width of the second areas 10 micrometer. When the second areas are not flat but have the form of walls, the height may for example be 5 micrometer.

When a plate has a patterned surface as shown in FIG. 3, the deposition method provides a patterned layer of first liquid. The hatched area in the Figure is covered by the first liquid deposited by an applicator moving from right to left in the Figure. Line 33 is the intersection of the leading interface 7 with the surface 2. The surface to the left of the line 33 is covered with air. The wavy character of the line is caused by the different wettability of the areas 31 and 32 for air and first liquid. The surface under the gap of the applicator, indicated by a brace 34, is covered by the first liquid.

At the trailing side of the applicator the thickness of the layer 13 of first liquid decreases, as shown in FIG. 1. When the thickness has become sufficiently small, the second liquid will displace the first liquid from the second areas 32 because of the greater affinity of these areas for the second liquid than for the first liquid. The first liquid on the first areas 31 will not be displaced by the second liquid, because these areas have a greater affinity for the first liquid than for the second liquid. As a result the method deposits a layer of first liquid only on the first areas 31.

Since the thickness of the layer of first liquid behind the applicator is relatively small, i.e. smaller than the height of the gap, it is relatively easy for the second liquid to remove the layer of first liquid from the second areas 32. When the gap has a height of 50 micrometer, the layer of first liquid to be removed is thinner than 50 micrometer. This should be compared with a layer of more than 1 millimeter thickness of first liquid in a known method, which has to be skimmed from second areas. As a consequence, the applicator according to embodiments can scan the surface substantially faster than the known gutter can scan the surface. A typical scan speed is 30 mm/s for the former and 3 mm/s for the latter.

In the embodiment of the method shown in FIG. 3, the trailing edge 35 between parts still covered by first liquid and parts covered by second liquid in the second areas 32 runs parallel to borderline 36 between first areas and second areas. In this situation it is more difficult for first liquid in a second area 37 to move away under the force of the second liquid and be replaced by it, because the first liquid has to move in a direction parallel to the trailing edge. In the differently oriented second area 38 the first liquid can easily move off the second area in the direction of movement of the trailing edge. This effect may cause remnants of first liquid to remain on the second area 37.

Figure 4:
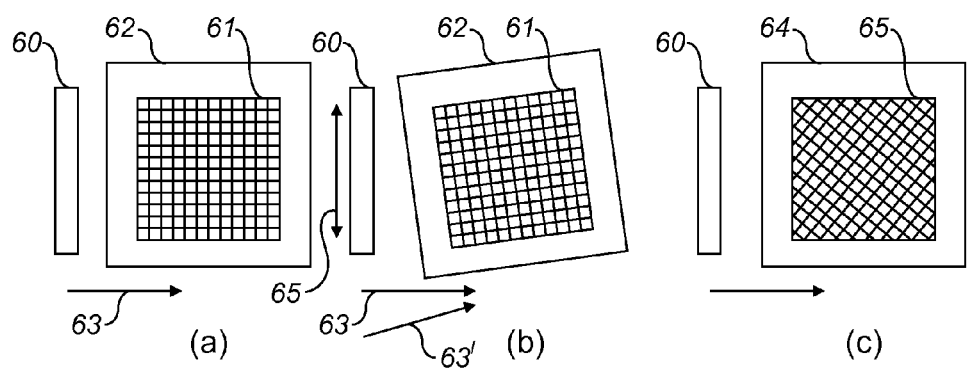
FIGS. 4(*a*), (*b*) and (*c*) show a first, second and third orientation for scanning the surface.

FIG. 4(a) shows a first orientation of the applicator 60 with respect to a surface having a pattern 61 of first and second areas arranged on a plate 62. The direction of scanning is indicated by arrow 63. The first orientation is the same as the orientation shown in FIG. 3. FIG. 4(b) shows a second orientation, in which the plate 62 together with the pattern 61 is rotated over an angle of approximately 8 degrees compared to the orientation in FIG. 4(a). The long axis 65 of the applicator 60 is now at the same angle of 8 degrees with the borderline 54. The trailing edge 35 in the second areas of the pattern will no longer run parallel to the borderline 36. As a result, the first liquid on the second area 37 can now easily flow away from the second areas. As a result, the first liquid is skimmed better off the second areas than in the case of FIG. 4(a). An improvement of uniformity is observed for angles larger than 5 degrees and for angles larger than 22.5 degrees the uniformity does not improve further noticeably. Note that the direction of scanning 63 in FIG. 4(b) may also be changed to 63', where the direction of scanning is parallel to the orientation of the pattern but is at an angle with the direction of the long axis 65. This direction of scanning is simpler to realize in a production apparatus.

FIG. 4(c) shows an alternative configuration, wherein the plate 64 has one of its edges parallel to the applicator 60 and the pattern 65 has borderlines at an angle unequal to zero with the leading interface of the dispenser. The trailing edge for a straight, elongate applicator is straight and has a direction equal to that of the long axis of the applicator. When the applicator is curved in a plane parallel to the surface, the trailing edge will also be curved. To avoid the above stick-slip motion, the local direction of the trailing edge should form a non-zero angle with the direction of the borderlines.

Figure 5:
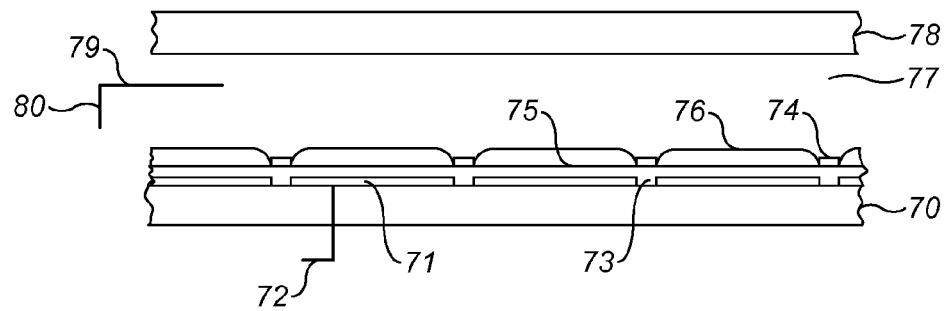
FIG. 5 shows a cross-section of an electrowetting element.

FIG. 5 shows a cross-section of a series of electrowetting elements made using the deposition method according to embodiments. A first substrate 70 is provided with electrodes 71, deposited as a thin-film conductor on the substrate. Each electrode is connected to a signal line 72 for providing a voltage. The electrodes are covered by a thin hydrophobic layer 73 of the amorphous fluoropolymer AF1600. The first substrate with the layers applied to it form a first support plate. A pattern of a thin hydrophilic layer 74 of SU8 divides the surface of the support plate in hydrophobic first areas 75 between the hydrophilic second areas 74. The size of the first areas is 160 micrometers square, the second areas have a width of 10 micrometers and a height of 3 to 6 micrometer.

The first substrate 70, provided with the layers 71, 73 and 74, is subjected, similar to plate 1, to the deposition method according to embodiments using oil as first liquid and water as second liquid or any other combination of liquids, for example as given above. After carrying out the method the first areas 75 are uniformly covered by an oil layer 76 having a thickness of between 3 and 6 micrometer, for example 5 micrometer. The second areas 74 and the oil layer are covered by water 77. The water may contain salt to increase its electrical conductivity and to enlarge the temperature window for the method. The second liquid, water in this example, used during the method may be the same liquid used in the product that includes the support plate, which avoids changing the second liquid after the execution of the method by another liquid.

A second support plate 78 forms a closed space between the first and second support plate. The space is protected from the environment by seals, not shown in the Figure, attached to both support plates. The pattern of the layer 74 defines elements on the support plate to which the oil layer 76 is confined. Each element has an electrode 71. Another electrode 79, connected to a signal line 80, is in contact with the water 77, forming a common electrode for a plurality of elements. When a voltage is applied between the common electrode 79 and the electrode 71 of an element, the oil layer 76 in that element moves to the side of an element or breaks up and the first surface will at least partly be covered by the water 77. This so-called electrowetting effect is more fully described in international patent application WO03/071346. When the oil and/or the water has specific optical properties for absorption, reflection and/or transmission of light, the element can operate as a light valve. The electrowetting elements may be used in a display apparatus, in which a plurality of electrowetting elements forms a display device. A display driving system in the apparatus provides the voltages for setting the elements in the desired state.

Figure 6:
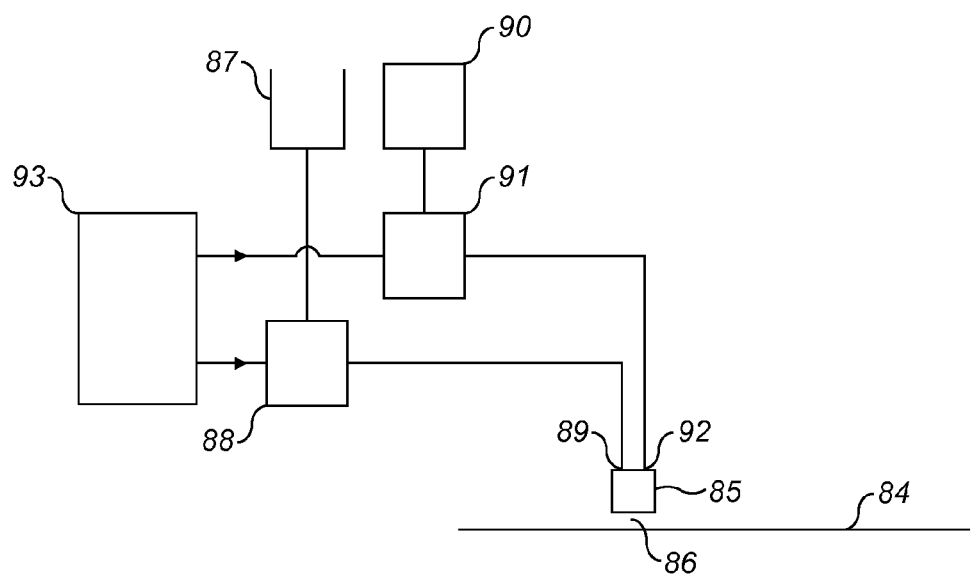
FIG. 6 shows an apparatus for carrying out the method.

FIG. 6 shows an apparatus for depositing a layer of liquid on a surface of a plate according to embodiments. The plate can be arranged on a stage 84. An applicator 85 forming a gap 86 with the surface is mounted on a translation stage, not shown in the Figure, that enables the applicator to scan over the stage 84. Alternatively, the applicator is fixed and the surface is mounted on a translation stage. A first container 87 for the first liquid is connected to a first control unit 88, e.g. a valve or a pump, that controls the amount of first liquid to be delivered to the applicator 85 via a connection 89. A second container 90 for the second liquid is similarly connected to a second control unit 91 for delivering the second liquid to the applicator via a connection 92. A controller 93 provides signals for setting the first and second controller to the desired settings. The apparatus may include a measurement device for determining the thickness of the deposited layer. The thickness value may be used as input for setting the control units. The apparatus may also include a device for measuring the shape and/or the size of the globule of first liquid or the volume of second liquid between the applicator and the surface, e.g. using a camera observing the applicator in the direction of its long axis, and use this input for setting the control units. The height of the dispenser above the surface may be kept at a desired value, for example by measuring the height at the two far ends of the elongate dispenser and maintaining these at equal values. The controller may also use manual input from an operator of the apparatus instead of measured values.

The above embodiments are to be understood as illustrative examples. Further embodiments are envisaged. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the accompanying claims.

What is claimed is:

1. A method of providing a layer of a first liquid on a first area of a surface the method comprising:
    positioning an elongate applicator relative to the surface, with an elongate gap having an elongate gap height of 50 micrometers or less between the elongate applicator and the surface;
    depositing an amount of the first liquid in the elongate gap to form an elongate globule of the first liquid;
    depositing an amount of a second liquid on a trailing side of the elongate applicator, and in contact with the trailing side of the elongate applicator and with the elongate globule of the first liquid, the second liquid being one or more of electroconductive or polar, the first liquid and the second liquid being immiscible with each other, and the first area having a higher wettability for the first liquid than for the second liquid;
    moving a respective one of the elongate applicator and the surface relative to a respective other of the elongate applicator and the surface;
    forming on the surface a first liquid layer, with part of the first liquid layer on the first area and part of the first liquid layer on a second area of the surface, the second area having a higher wettability for the second liquid than for the first liquid;

depositing the amount of the second liquid as a second liquid layer on the first liquid layer; and part of the second liquid layer displacing the part of the first liquid layer on the second area to remove the part of the first liquid layer on the second area from the second area and deposit the part of the second liquid layer on the second area.

2. The method according to claim 1, comprising filling the elongate gap with the elongate globule of the first liquid by the depositing the amount of the first liquid in the elongate gap.

3. The method according to claim 1, comprising the depositing the amount of the first liquid in the elongate gap during the moving the respective one of the elongate applicator and the surface relative to the respective other of the elongate applicator and the surface.

4. The method according to claim 1, wherein the surface is substantially horizontal.

5. The method according to claim 1, wherein the surface comprises a plurality of first areas, comprising the first area, separated by second areas, comprising the second area, and forming a pattern.

6. The method according to claim 5, wherein the elongate gap has a length at least equal to a dimension of the pattern parallel to a long axis of the elongate applicator.

7. The method according to claim 1, wherein the moving the respective one of the elongate applicator and the surface relative to the respective other of the elongate applicator and the surface is in a direction substantially perpendicular to a long axis of the elongate applicator.

8. The method according to claim 1, wherein the second area is neighbouring the first area, and a borderline between the first area and the second area and a direction of a long axis of the elongate applicator form an angle different from zero.

9. The method according to claim 1, wherein a first scan of the surface by the elongate applicator comprises the moving the respective one of the elongate applicator and the surface relative to the respective other of the elongate applicator and the surface, and the method further comprises a second scan of the surface comprising moving the respective one of the elongate applicator and the surface relative to the respective other of the elongate applicator and the surface.

10. The method according to claim 1, wherein the surface is part of a first support plate and the method comprises positioning a second support plate with the first liquid layer and the second liquid layer between the first support plate and the second support plate.

11. The method according to claim 10, wherein the first support plate and the second support plate with the first liquid layer and the second liquid layer therebetween at least partly form an electrowetting element.

12. The method according to claim 1, wherein the trailing side of the elongate applicator has a higher wettability for the second liquid than for the first liquid.

13. The method according to claim 1, wherein the elongate gap is between the surface and a side of the elongate applicator with a higher wettability for the first liquid than for the second liquid.

14. The method according to claim 1, wherein the depositing the amount of the second liquid on the trailing side of the elongate applicator comprises substantially covering the trailing side of the elongate applicator with the amount of the second liquid.

15. The method according to claim 1, wherein the elongate applicator comprises a first side in contact with the elongate globule of the first liquid, and the trailing side is connected to the first side along an edge of the elongate applicator.

16. The method according to claim 15, wherein the first surface is angularly displaced from the trailing side by substantially 90 degrees.

17. The method according to claim 15, wherein the depositing the amount of the first liquid comprises dispensing the amount of the first liquid from a first opening located in the first side, and the depositing the amount of the second liquid on the trailing side of the elongate applicator comprises dispensing the amount of the second liquid from a second opening located in the trailing side.

18. The method according to claim 1, wherein the elongate gap is free from the second liquid.

19. The method according to claim 1, wherein a leading side of the elongate applicator is free from the second liquid.

20. The method according to claim 1, wherein the depositing the amount of the second liquid on the trailing side of the elongate applicator comprises depositing the amount of the second liquid only on the trailing side of the elongate applicator.

21. The method according to claim 1, wherein the forming on the surface the first liquid layer comprises forming the first liquid layer within a first liquid layer height less than the elongate gap height and less than 50 micrometers.

* * * * *